(12) United States Patent
Coushaine

(10) Patent No.: US 7,360,925 B2
(45) Date of Patent: *Apr. 22, 2008

(54) LED LIGHT SOURCE ASSEMBLY

(75) Inventor: Charles M. Coushaine, Rindge, NH (US)

(73) Assignee: Osram Sylvania Inc., Danvers, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/347,597

(22) Filed: Feb. 3, 2006

(65) Prior Publication Data

US 2006/0126328 A1 Jun. 15, 2006

(51) Int. Cl.
*F21V 21/00* (2006.01)

(52) U.S. Cl. ............. 362/249; 362/252; 362/294; 362/373

(58) Field of Classification Search ............ 362/245, 362/247, 249, 507, 516, 545, 547, 800, 235, 362/241, 294, 362, 373, 252

See application file for complete search history.

(56) References Cited

U.S. PATENT DOCUMENTS

| | | | |
|---|---|---|---|
| 6,499,860 B2 * | 12/2002 | Begemann | 362/230 |
| 6,652,122 B2 * | 11/2003 | Lin | 362/250 |
| 2003/0063476 A1 * | 4/2003 | English et al. | 362/545 |

* cited by examiner

*Primary Examiner*—Thomas M. Sember
(74) *Attorney, Agent, or Firm*—William E. Meyer

(57) ABSTRACT

A compact LED light source providing intensive LED positioning along with thermal dissipation can be made with a heat conductive plate supporting a plurality of LEDs mounted on the plate and in thermal contact with the plate. The plate further supports electrical circuitry providing electrical connection to the LEDs. A heat conductive stem mechanically supports the plate and may provide a thermal conduction path from the plate away from the LEDs. A high concentration of LED can then be conveniently mounted and held in close proximity for increased optical system intensity, while providing a thermal exit path for the associated increase in heat concentration.

6 Claims, 9 Drawing Sheets

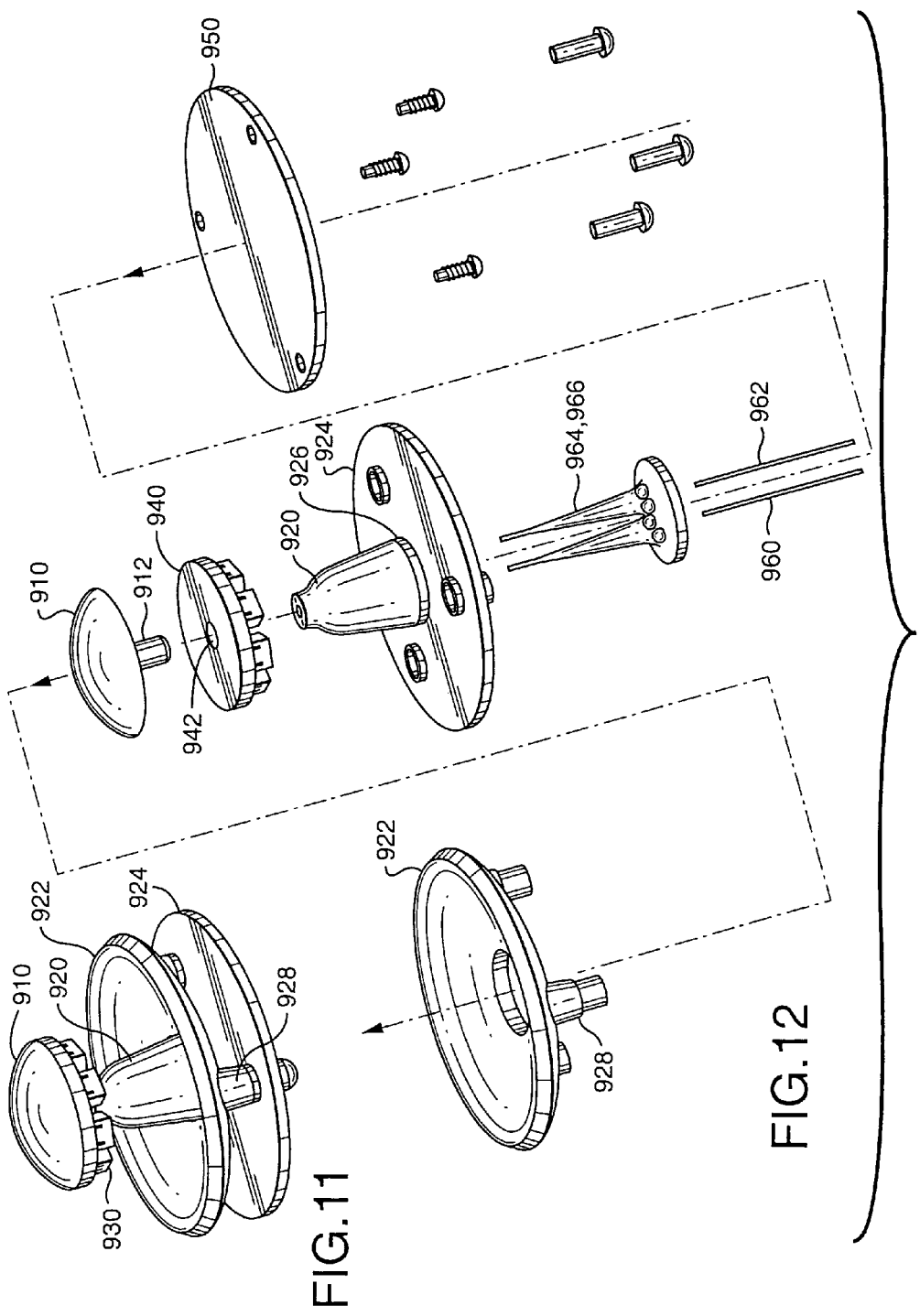

LED LIGHT SOURCE ASSEMBLY

The Applicants hereby claim the benefit of their provisional application, Ser. No. 60/371,015 filed Apr. 9, 2002 for Snap Together Automotive LED Lamp Assembly; and Ser. No. 60/490,493 filed Jul. 28, 2003 for LED Light Source Assembly.

TECHNICAL FIELD

The invention relates to electric lamps and particularly to electric lamps using LED light sources. More particularly the invention is concerned with LED light sources supported on a heat conductive plate in a reflector type lighting assembly.

BACKGROUND ART

LEDs offer both increased lamp life and electrical efficiency. Presently they have insufficient individual luminous output to replace most other lamp forms (incandescent, tungsten halogen, fluorescent, and high intensity discharge). LEDs can be grouped together to accumulate sufficient light output to compete with some of the other light sources. Because the individual LEDs are necessarily spaced apart, the grouped structures can fail to provide an adequate cumulative intensity. They may also produce high heat concentrations that shorten LED life. Because LEDs need to be individually wired into the grouped structure, such assemblies can require tedious or expensive assembly. There is then a need for an LED lamp structure that is readily manufactured, that provides relatively good cumulative intensity and provides good heat dissipation.

DISCLOSURE OF THE INVENTION

A compact LED light source providing intensive LED positioning along with good thermal dissipation can be made with a heat conductive plate supporting a plurality of LEDs mounted in thermal contact with the plate. The plate further supports electrical circuitry providing an electrical connection to the LEDs. A heat conductive stem mechanically supports the plate and may provide an electrical conduction path and a thermal conduction path away from the LEDs.

BRIEF DESCRIPTION OF THE DRAWINGS

FIG. 11 shows an exploded view of the LED lamp assembly of FIGS. 8, 9 and 10

FIG. 12 shows a perspective view of the assembled lamp of FIG. 11.

BEST MODE FOR CARRYING OUT THE INVENTION

A light source assembly may be formed from a heat conductive plate, supporting a plurality of LEDs; and connecting electrical circuitry. A heat conductive stem to duct heat from the plate supports the plate. The stem may be further supported on a base.

Figure 1:
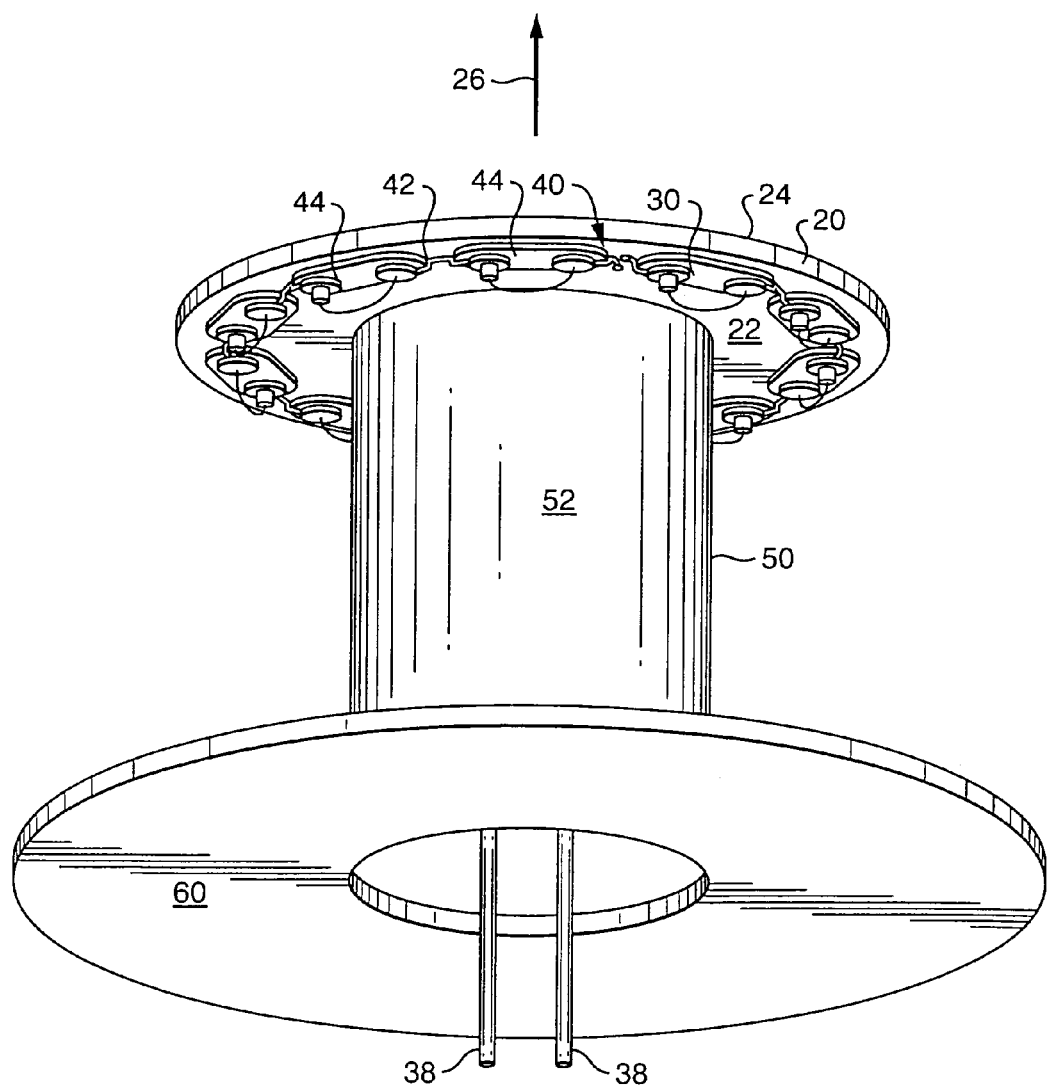
FIG. 1 shows schematic view of a plate supporting a plurality of LED light sources coupled to stem with a heat sink.

FIG. 1 shows a schematic design of a simple plate 20 supporting a plurality of LED light sources 30 connected by circuit traces (electrical circuitry 40). The LEDs 30 are mounted on circuitry pads 44. The preferred plate 20 may be formed from a metal or circuit board material with an inner side 22 and an outer side 24 facing in a forward direction 26. The plate 20 is a substantially solid, heat conductive piece. It is preferably round to enable rotational processing during LED mounting and assembly. It is a convenient aspect of the circular plate structure, that the plate 20 may be axially mounted in a machine for indexed rotation to LED mounting stations. The plate 20 may then be populated with LEDs 30 by indexed rotations followed by robotic welding of an LED chip to the pad 44, followed by jump wire or similar welds between the pads 44, and the LED chips. The plate, LEDs and circuitry may be similarly rotated through a coating material to preserve and protect the LEDs. It is understood that other plate shapes may be used. Coupling features may be included in the plate such as a soldier or glue groove, a threaded hole, or a through passage for a threaded coupling, and so on enabling the plate 20 to be joined to the supporting stem 50. Additionally the plate 20 may include electrical wire ways, or other electrical connection accommodating features to enable the LEDs and circuitry to be coupled on one or both sides in a convenient fashion. The plate 20 may also include decorative or esthetic features, such as a dome or similar shape with a mirror, white, black or colored front surface.

The preferred plate 20 carries printed circuit traces 40. In the preferred embodiment the circuit traces link the LEDs 30 in a series circuit. The circuit traces 40 may be formed in substantially known ways by laying down insulating, conductive, and protective layers as may be necessary in electrically conductive strips 42 connecting a plurality of mounting pads 44. The mounting pads 44 may be structured to support either LED chips ("chip on board" structure) or LED packages (such as TOPLEDs). In the preferred embodiment, the electrical circuitry 40 is formed on one side of the plate, and more particularly the inside surface 22. The trace lines 42 then link to the series of pads 44 arranged in one or more rings around the center of the plate 20. It is understood that there may be more then one series of LEDs within the various circuitry alternatives. For example there may be a first ring and a second ring, or alternate LEDs may be coupled in a first group and a second group thereby enabling a low beam (one set of LEDs illuminated) and a high beam (an alternative set or both sets of LEDs illuminated), or enables a white output and a separate colored (red, amber, etc.) output. It is also possible to tune the light beam in the circuitry lay out by segmenting the rings into subsets enabling in right or left side illuminations that in combination with a reflector provide for beams angled to the right or left that may be combined in adjustable ratios. Similarly one may tune the intensity of such beam angling. It is equally possible to incorporate subsets of LEDs on a single support for alternative functions such as a fog, signal, warning, colored and other illumination purposes. It is understood that individual pads 44 may be separately located at chosen points on the plate 20 and the pads 44 wired together by jumper wires. The jump wire structure is considered less desirable, being more costly to completed and more prone to mechanical injury.

LEDs 30 are mounted on the pads 44 and finally coupled into the circuit structure 40. It is common misnomer to apply the term "LED" to the typical commodity LED package comprising an LED chip, a reflector, and wire connections that are then enclosed in a plastic housing. These pre-assembled LED package units can be less thermally and optically efficient than individually mounted LED chips ("chip on board"). A preferred aspect of the present design is to use a "chip on board" construction, where the LED chips are mounted directly on the support structure, enabling relatively greater heat removal, and greater light emission. The preferred general method is to couple the LED chip to a first conductive surface of a pad 44, and then connect a jumper wired from an exposed side of the LED chip to a second coupling point on that pad 44. The pads (and LEDs) are then chained together in a series circuit 40. The series circuit 40 is a preferred because failure of one LED causes the lamp to go out, forcing replacement of the whole failing structure. In contrast, a parallel circuit tolerates a progressive failure of individual LEDs that can be a deceptively dangerous reduction in total light as successive LEDs fail. Once the group of LED chips are mounted on their respective pads ("chip on board") and wired together, the relevant portions, for example, the LED bearing side of the plate; or the whole assembly may be coated with a clear protective coating, such as a clear silicone or epoxy as is known in the art. The coating resists penetration by moisture and mechanically protects the LED chips and fine wires. The coating process and materials are known in the art. The plate 20 is mounted on a thermally conductive stem 50 to conduct heat away form the plate. The stem 50 may be a hollow column with an exterior surface 52 formed to be reflective to enhance light output, or formed to be minimally reflective to enhance the system optics and limit uncontrolled light projection (glare) as may be preferred. The stem 50 is preferably in turn coupled to a thermally conductive radiator, such as a heat conductive disk 60. Electrical connectors 38 may be passed through the column 50 and disk 60 to be connected to the circuit 40 on plate 20

Figure 2:
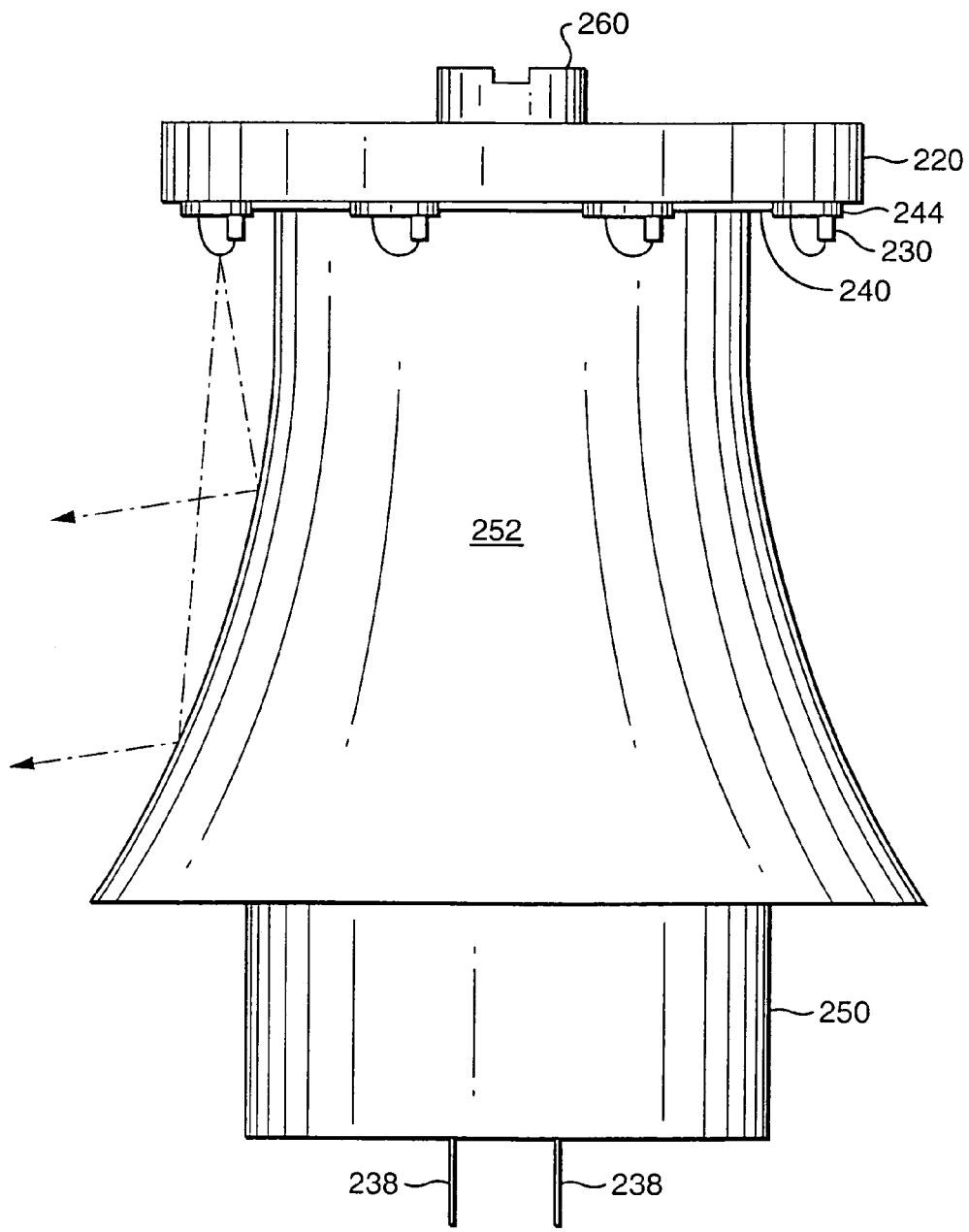
FIG. 2 shows an alternative plate and stem supporting a plurality of LED light sources.

FIG. 2 shows an alternative schematic view of a flat plate 220 supporting LED chips 230 on pads 244 electrically coupled by circuit traces 240. The plate 220 is mechanically coupled to a stem 250 with a curved reflective surface 252 designed to direct light from the LEDs 230 sideways to other optical elements, such as a reflector, lens or light guide. The stem 250 includes a central passage for electrical leads 238 to couple with the circuit traces 240. In one embodiment the plate 220 was about 13 millimeters in diameter, and about 1.6 millimeters thick. Eight LEDs were equally distributed around the periphery of the lower side of the plate.

The stem 50, 250 may be a simple hollow tube formed by known techniques to support the plate 20, 220. The preferred stem 50, 250 is structured to conduct heat from the plate 20, 220. A metal stem 50, 250 is preferred. The plate 20, 220 may be welded, screwed, soldiered, glued, or similarly coupled to the forward or distal end of the stem 50, 250. The opposite end or base of the stem 50, 250 may be conveniently formed to couple to a base structure. In a vehicle context, a lamp is subject to constant vibration. The stem 50 should then be sufficiently stiff to prevent sway of the plate 20 during normal operation. The preferred stem has an outer diameter about half the diameter of the plate. In the preferred embodiment the stem 50, 250 has a hollow center. The electrical connection leads 38, 238 may then be extended through the hollow center of the stem 50, 250. The exterior surface of the stem 50, 250 is exposed to the light generated by the LEDs 30, 230. The exterior surface 52, 252 of the stem should then be appropriately designed optically. In one preferred embodiment the exterior surface 52, 252 of the stem includes a mirror finish and is smoothly arced to direct light towards an associated optical system of a reflector and lens. Optical design is considered to be in the scope of skilled art given the preferred beam pattern, and similar design choices and requirements. In an alternatively preferred embodiment the stem is a straight, narrow column to minimize interception and reflection of light from the LEDs.

The preferred stem is mechanically coupled to a base, which may include coupling features to join with a reflector or similar optical housing by known methods. In the preferred embodiment the base structure also includes heat-sinking features. The stem then provides a heat conductive path from the plate to the heat sinking features. The plate 20 and the stem 50 should then have a sufficiently broad coupling to enable good heat flow from one to the other. Similarly the stem 50 should have an equally or even broader base to conduct heat from the stem.

The lamp assembly may be structured to be replaceable with respect to a reflector or similar optical assembly, This generally requires a more expensive socket to enable correct positioning of the LED lamp assembly, exclusion of water and dirt, and so on while tolerating the removal and replacement of the standard lamp. Because LEDs can have a life of up to 100,000 hours, there may be no reason to enable lamp replacement. The LED lamp assembly may then be designed as a standard component that is permanently installed in a selected one of many possible optical housings (reflector or lens system) with the expectation that if there were a failure, the whole lamp structure would be replaced. The cost of the socket is then reduced. The whole lamp assembly may be factory aimed, and sealed. The standard LED lamp assembly can then be used as a standard component with any number differing optical housing systems.

Figure 3:
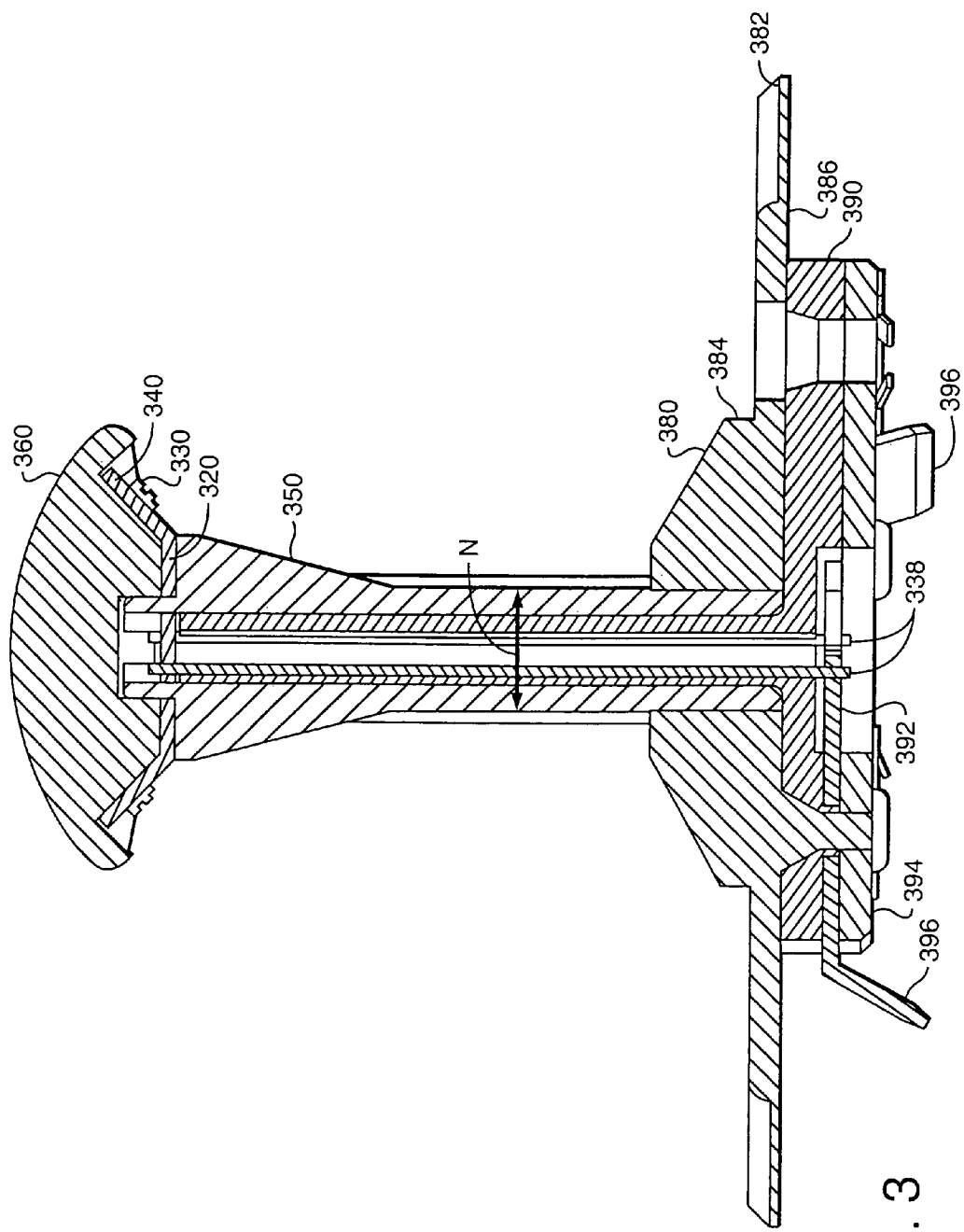
FIG. 3 shows an alternative plate and stem supporting a plurality of LED light sources.

FIG. 3 shows an alternative plate and stem supporting a plurality of LED light sources. The plate 320 includes a series of peripheral petal like tabs 340 that are bent upwards at an angle to the plane transverse to the stem axis. Each tab 340 supports an LED assembly (package, or chip on board). Plate 320 is trapped between the stem 350 and a heat conductive head 360. The coupling between the stem 350 and the head 360 may be a compression fit, bayonet mount or a similar construction. As shown, the stem 350 end includes two semicircular pillars 370 that form a tight compression fit with one or more recesses formed in the head 360. The plate 320 is trapped in the compression between the stem 350 and the dome 360 enabling good thermal conduction from the plate 320 and to the head 360 and stem 350. The plate 320 may be held in a recess formed on the top of the stem 350. Connecting electrical leads 338 may be extended through the stem 350 to the base assembly for electrical connection. The plate 320 may be held in place by compression, friction, potting, epoxy, or other methods. In one embodiment, the plate made a thickness of about 1 millimeter. The plate had ten peripheral tabs that were conveniently bent at a 52 degree angle to the plane transverse to the stem axis. The dome had a diameter of about 20 millimeters. The dome to base distance was about 24 millimeters. The stem 350 was made of copper and had a middle height diameter of about 8 millimeters. The mating surface 384 had a diameter of about 21 millimeters.

Figure 4:
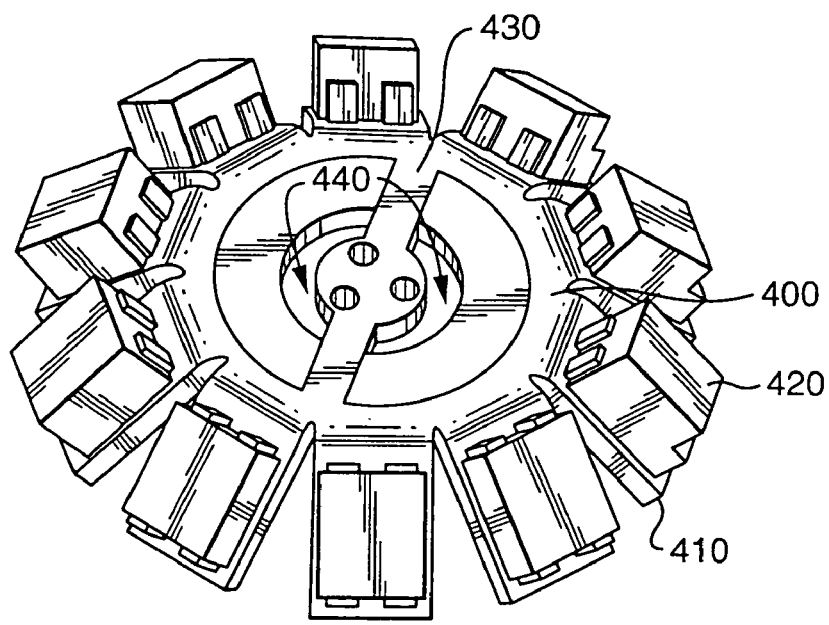
FIG. 4 shows a plate supporting a plurality of LED light sources
Figure 5:
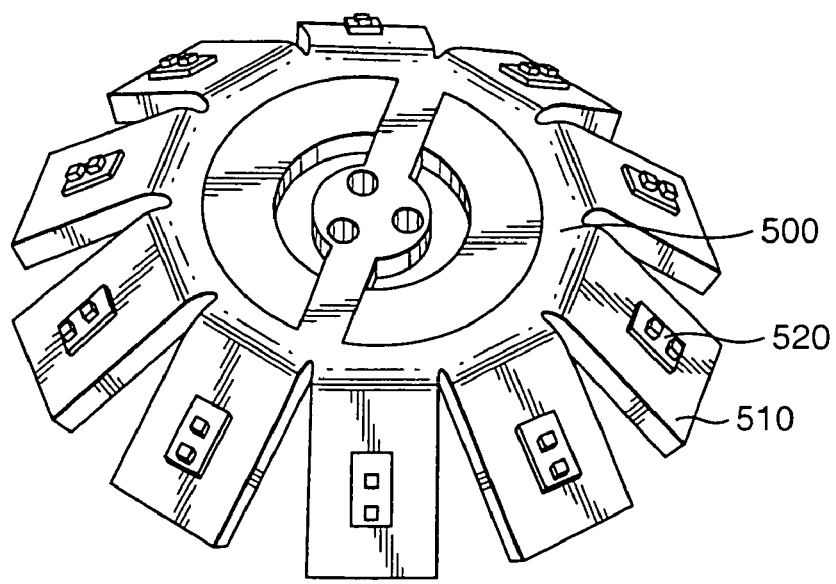
FIG. 5 shows an alternative plate supporting a plurality of LED chips sources coupled to a support stem.
Figure 6:
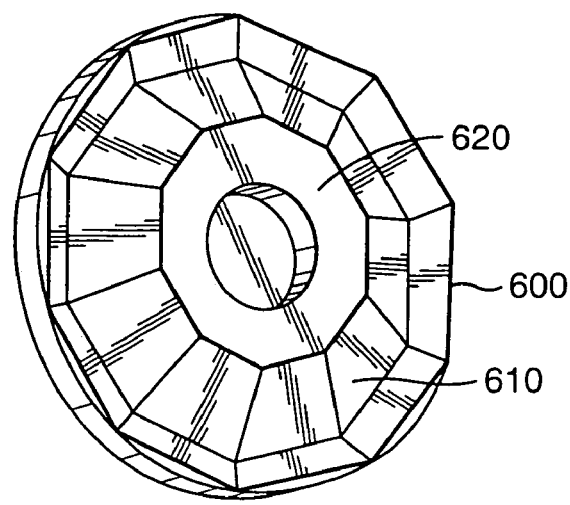
FIG. 6 shows a plate for supporting a plurality of LED light sources
Figure 7:
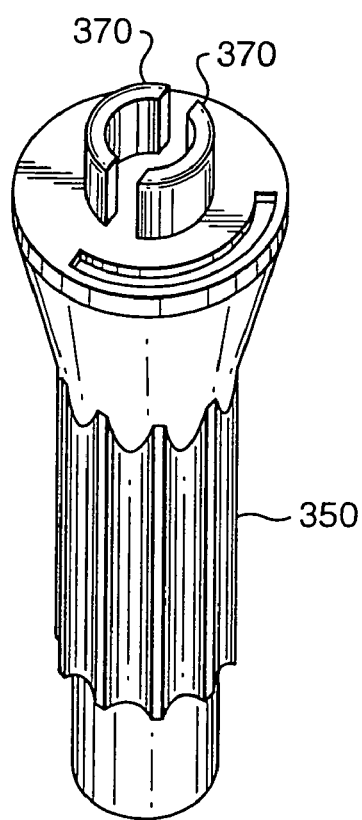
FIG. 7 shows a stem for supporting a plate.

FIG. 4 shows a convenient layout of a stamped disk 400 with a crossbar 430 and two cut outs 440 that can mate with the two semicircular pillars 370. The crossbar 430 is formed to align the disk 400 rotationally with the respect to the stem 350. The radial edge of the disk 400 is formed with a plurality of radially extending tabs or fingers 410 that support-LED packages 420. The fingers 410 are angled with respect to the stem axis to point the LEDs 420 in a preferred direction, and correspondingly touch the lower (inside) surface of the head 360 for thermal conduction from the disk 400. Appropriate circuitry traces (not shown) may be laid out on the disk 400, fingers 410, and cross bar 430 to electrically couple the LEDs 420 through the stem center. FIG. 5 shows a similar disk 500 with fingers 510 supporting a chip on board construction with LED 520. Again the circuit traces are not shown. FIG. 6 shows a similar stamped disk 600. The disk 600 may be made from a material with high thermal conductivity, such as copper. The disk 600 may be stamped to have facets 610 to support circuitry and align corresponding LED packages or LED chips ("chip on board") as the case may be in a preferred angle to the lamp (stem) axis, while the center region 620 of the disk 600 is in thermally conductive contact with an associated stem and head if any.

Turning again to FIG. 3, the preferred stem 350 is supported in a thermally conductive disk or plate 380 that is exposed at least along its circumference edge 382 to air. The preferred plate 380 is cast or stamped metal, such as cast zinc or stamped copper, and may be blackened to enhance thermal radiation. The front side of the plate 380 may include appropriate mating features 384 to guide or couple the lamp assembly into a lamp socket. The mating features 384 may be a threading, bayonet, clip latching, compression fit or other known latching features. In one embodiment the plate 380 had a mating diameter (at 384) of 21 millimeters, and a peripheral diameter (at 382) of about 36 millimeters.

Figure 8:
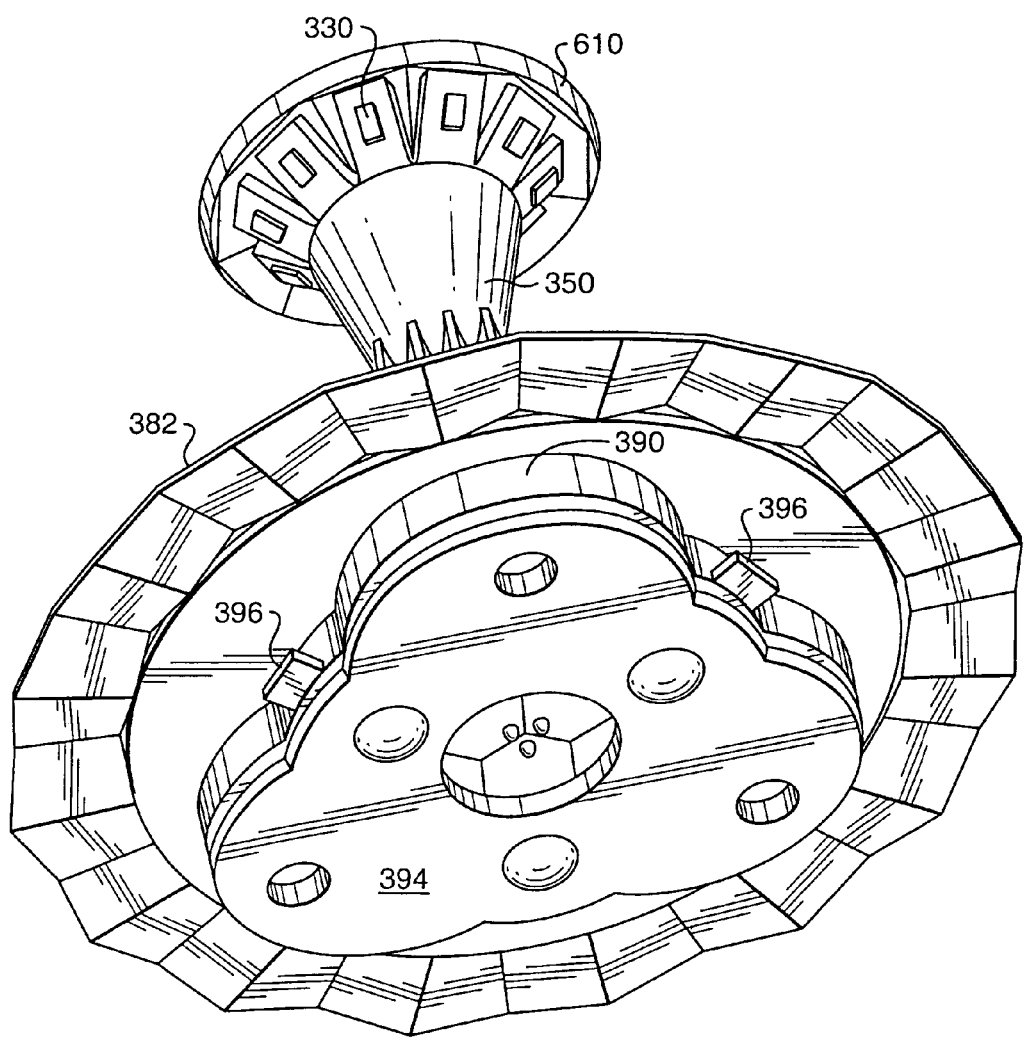
FIG. 8 shows a bottom perspective view of the construction of FIG. 3

The preferred plate 380 includes a back 386 abutting an electrically insulating portion 390 enclosing circuitry for the lamp supported on a circuit board 392. A cover 394 may be attached to enclose the circuit board 392, allowing electrical connectors to protrude such as lug ends 396. FIG. 8 shows a bottom perspective view of the construction of FIG. 3

The angle of the fingers, or of the bevel with respect to the stem can then be set in advance to influence the degree of light spread, or other optical purposes. Interchangeable parts may then include stems of differing lengths, plates of differing. radii, or circuitry, and fingers with differing angularity, and LEDs of differing colors, all of which may otherwise have standard assembly features. In this way a variety of lamp performances may be achieved from mixing and matching a limited number of basic parts that may otherwise be assembled in standard ways.

The forward (or top) surface of the plate may be enclosed with an esthetic, light or heat reflective shield, or heat dissipating plate or head 360. Such a shield, cover or head 360 may be attached to the plate by numerous known methods, including press fitting one or more extensions into one or more recesses.

Figure 9:
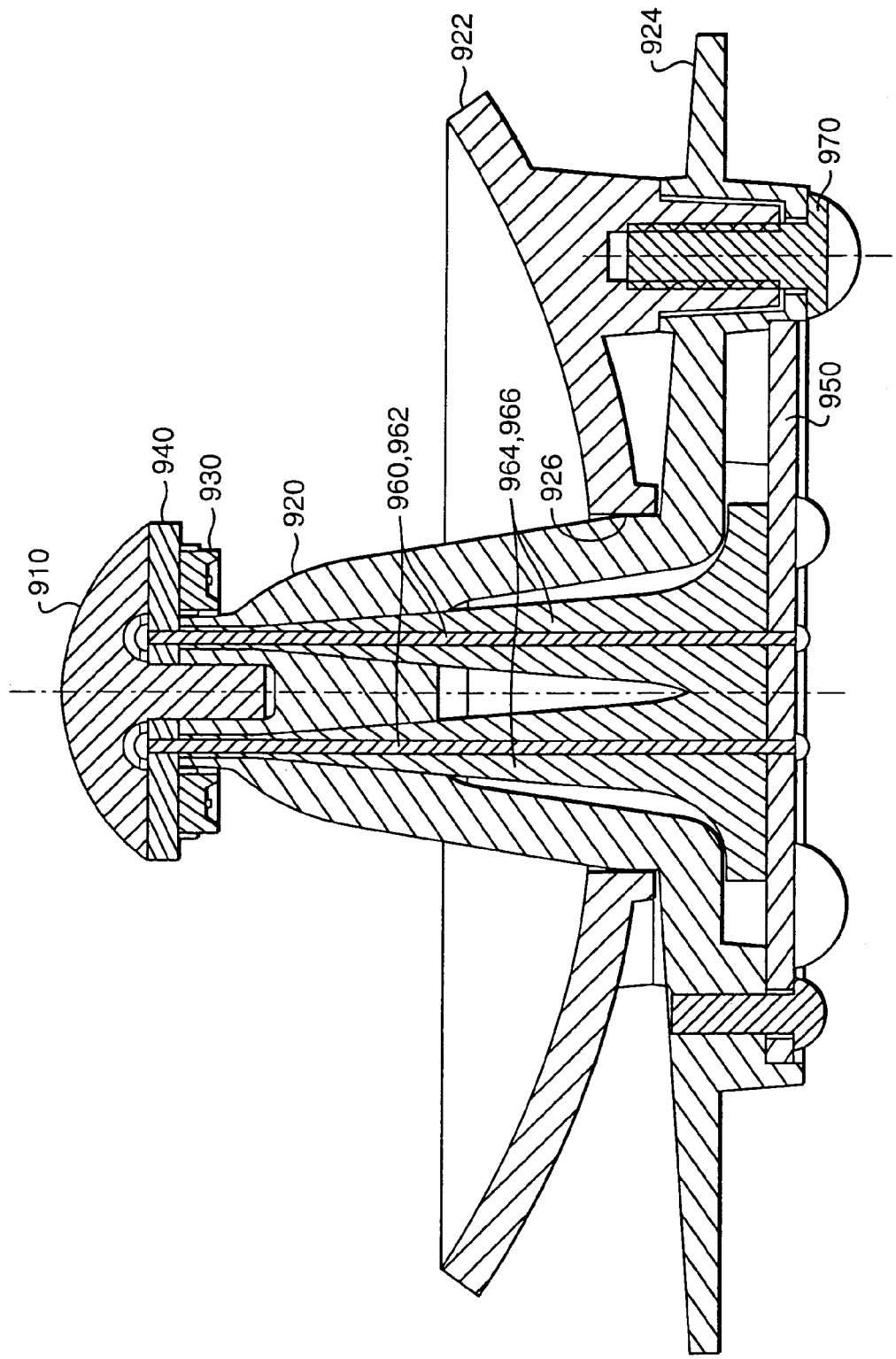
FIG. 9 shows a cross sectional of an alternative LED lamp assembly of FIG. 8

In an alternative preferred embodiment, FIG. 9 shows a mushroom type lamp coupled to a heat sink-radiator. The head 910 and stem 920 of the mushroom are made of metal to conduct heat to the radiator 924. The LEDs 930 are mounted on a disk 940 under the rim of the cap 910 to direct light generally down toward the stem 920 and the surrounding reflector 922. The LEDs 930 are mounted to the disk 920 so as to conduct heat to the cap 910, and stem 920 for conduction to the radiator 924. The bottom side of the radiator 924 is preferably formed with a cavity to retain a circuit board 950 for controlling the LEDs 930. The circuit board 950 may be pressed in place or similarly mounted as may be convenient. A cover plate for the cavity may be used to shield the circuit board. In one embodiment the dome 910 had a diameter of about 20 millimeters, and the stem had a wall thickness of about 3 millimeters.

The preferred alternative stem 920 is formed with a heat radiating skirt 924 as a single piece. The skirt 924 may include through passages so as to be screwed or riveted to the back of the reflector 922. Latching, snap, clip or similar coupling features may be formed on the skirt and reflector (or optical housing) to couple the two pieces. Conductive leads 960, 962 extend from the disk 940 through the stem 920 to the circuit board 950. Guiding and insulating the leads 960, 962 is or are one or more electrically insulating lead guides 964, 966 designed to funnel the leads through the stem passage (or passages) for exposure and connection of the distal (front end) of the stem 920. In the preferred embodiment the stem center is funnel shaped and the lead guides 964, 966 are conformally shaped conical sections. The lead ends project at each end of the insulating sheath so the contact may be made at the LED end and the circuit board end. It is convenient to form the core passage as a funnel or funnels and the insulative sheath or sheath sections as cone that mate with the funnels. In this way the leads may be easily positioned correctly in the core of the stem.

Figure 10:
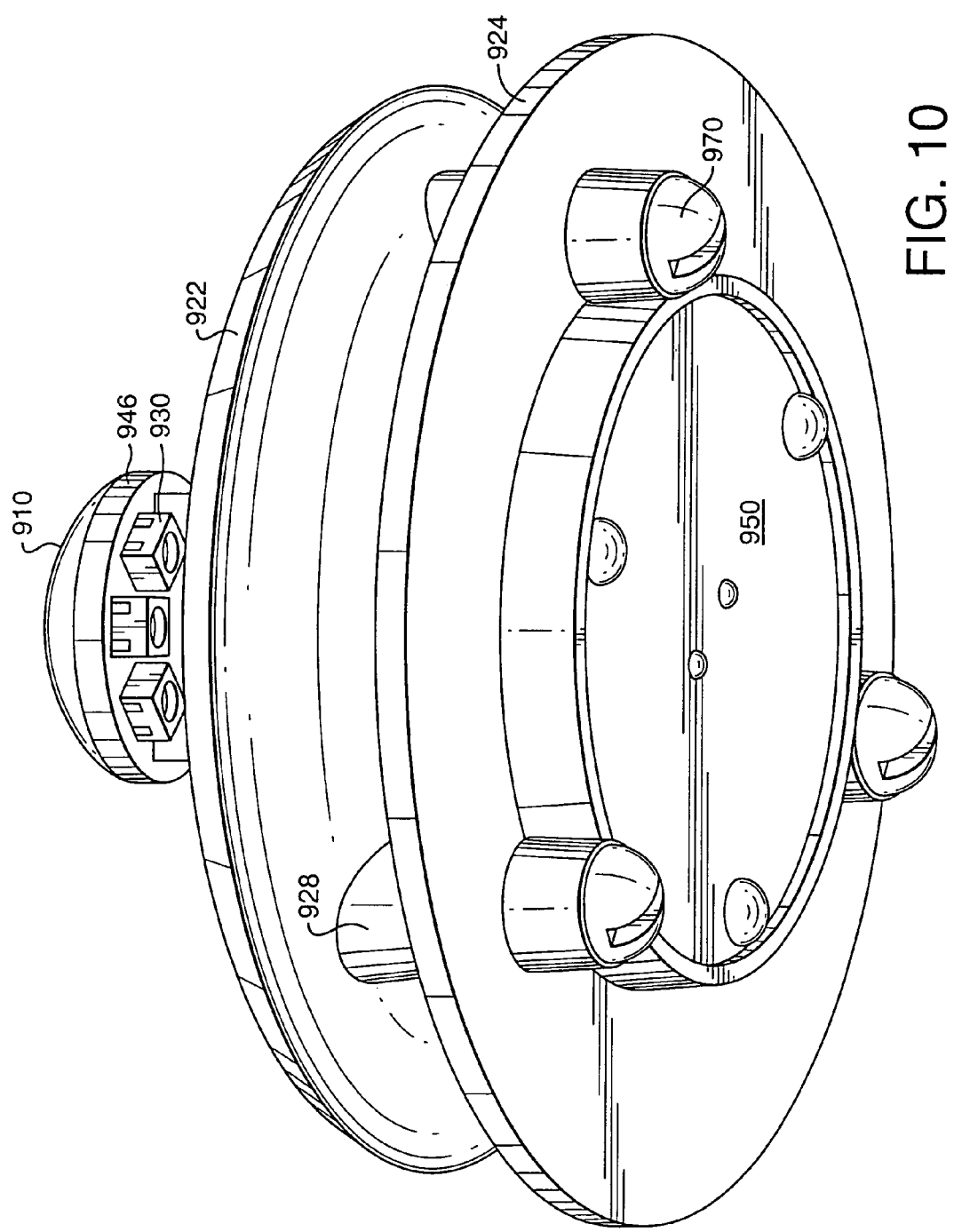
FIG. 10 shows a bottom perspective view of the alternative LED lamp assembly of FIG. 9

FIG. 10 shows a bottom perspective view of the LED lamp assembly of FIG. 9 having the heat radiating skirt 924 screwed by screws 970 to the back of the reflector 922.

FIG. 11 shows the LED lamp assembly inserted axially through a rear hole formed in a reflector or housing with the cap 910 and stem 920 substantially extending above the surface of the reflector 922. The heat sink 924 may be mounted to stand off bosses 928 molded into the back of the reflector or housing using rivets or screws for example.

FIG. 12 shows a schematic view of the assembly sequence of the second embodiment. The plate 920 with the attached LEDs 930 is formed in advance. The circuit board 950 and cover plate if any are formed in advance. The leads 960, 962 are attached to the circuit board 950. The insulating guides 964, 966 are threaded over the leads 960, 962. The circuit board assembly is pressed, riveted or screwed into the cavity formed in the back of the stem, so the leads end are exposed to the stem front. The preformed disk 940 carrying the LEDs 930 is then positioned on the stem end and the electrical connections to the leads 960, 962 completed. The rivet end 912 of the dome 910 is then pressed through a hole in the disk 940 to mate with the distal end of the stem 920, pinching the plate 940 in place and completing thermal conduction path from the plate 940. The lamp assembly is now complete. The dome end of the lamp may be threaded through a reflector opening. Keyways, seals, and similar features typical of lamp to reflector couplings may be used as are known in the art. The lamp is now properly positioned with respect to the reflector. The skirt 924 as shown may be screwed to the back of the reflector 922.

The disk supporting the LEDs provides a convenient preassembly platform enabling convenient manufacture. The close mounting of the LEDs provides relatively good intensity as a light source. Similarly the solid thermal coupling of the disk to the dome, stem and heat sink radiating skirt provides good thermal dissipation of heat generated by the concentrated array of LEDs. While there have been shown and described what are at present considered to be the preferred embodiments of the invention, it will be apparent to those skilled in the art that various changes and modifications can be made herein without departing from the scope of the invention defined by the appended claims.

What is claimed is:

1. An LED lamp assembly comprising:

an axially extending stem having a base end, a distal end and an axial stem passage extending therebetween;

at least one electrical lead extending in the stem passage;

a rigid heat conductive plate having a first side and a second side; the plate being mounted on the distal end of the stem with the first side facing towards the base end; the plate extending transversely to the axis, the plate having a greater radial extension than a radial extension of the stem adjacent the mounting to the plate whereby the radial periphery of the plate overhangs the stem;

electrical circuitry adjacent a side of the plate thereby forming a plate assembly;

the plate assembly having a plate assembly passage;

at least one LED attached to the plate assembly with the LED in electrical connection with the circuitry and in thermal connection with the plate; and a cap mechanically coupled through the plate assembly passage to the stem trapping the plate assembly between the cap and the stem.

2. The LED lamp assembly in claim 1, wherein the stem is mechanically pressed to the plate assembly by the cap thereby providing thermal conduction from the plate assembly to the stem.

3. The LED lamp assembly in claim 1, wherein the lead is mechanically pressed to the plate assembly by the cap thereby providing an electrical connection from the plate assembly to the lead.

4. The LED lamp assembly in claim 1 wherein the plate includes formed cut-outs, the stem includes formed protrusions shaped to fit in the cut-outs, and the plate is assembled to the stem with the protrusions positioned in the cut outs, thereby keying the plate with respect to the stem.

5. The LED lamp assembly in claim 1, wherein the plate is a metal stamping including at least one peripheral tab, and the at least one LED is attached to the at least one tab.

6. The LED lamp assembly in claim 5, wherein the tab is bent to provide a preferred mounting angle for the at least one LED.

* * * * *